United States Patent
Uziel

(10) Patent No.: US 6,764,386 B2
(45) Date of Patent: Jul. 20, 2004

(54) AIR BEARING-SEALED MICRO-PROCESSING CHAMBER

(75) Inventor: Yoram Uziel, Post Misgav (IL)

(73) Assignee: Applied Materials, Inc., Santa Clara, CA (US)

( * ) Notice: Subject to any disclaimer, the term of this patent is extended or adjusted under 35 U.S.C. 154(b) by 170 days.

(21) Appl. No.: 10/209,651

(22) Filed: Jul. 30, 2002

(65) Prior Publication Data

US 2003/0134574 A1 Jul. 17, 2003

Related U.S. Application Data

(60) Provisional application No. 60/347,726, filed on Jan. 11, 2002.

(51) Int. Cl.[7] .................................. B24B 1/00
(52) U.S. Cl. ...................... 451/39; 451/36; 451/388
(58) Field of Search ................... 451/39, 36, 388, 451/28, 41, 285–289, 451, 446

(56) References Cited

U.S. PATENT DOCUMENTS

| 4,987,286 A | | 1/1991 | Allen | |
|---|---|---|---|---|
| 5,202,008 A | * | 4/1993 | Talieh et al. | 204/192.32 |
| 5,898,179 A | | 4/1999 | Smick et al. | |
| 5,921,560 A | * | 7/1999 | Moshtagh | 279/3 |
| 5,931,721 A | * | 8/1999 | Rose et al. | 451/89 |
| 6,056,632 A | * | 5/2000 | Mitchel et al. | 451/288 |
| 2001/0055937 A1 | * | 12/2001 | Wada et al. | 451/36 |
| 2004/0009738 A1 | * | 1/2004 | Doi et al. | 451/36 |
| 2004/0029494 A1 | * | 2/2004 | Banerjee et al. | 451/39 |

FOREIGN PATENT DOCUMENTS

WO   WO 00/38935   7/2000

* cited by examiner

*Primary Examiner*—Lee D. Wilson
(74) *Attorney, Agent, or Firm*—Blakely Sokoloff Taylor & Zafman, LLP

(57) ABSTRACT

Apparatus for processing a surface of a substrate includes a chamber containing a cavity that has one side that is open, the chamber wall including a lip surrounding the open side of the cavity. Gas ports, disposed within the chamber wall and opening through the lip, emit a pressurized gas so as to create a gas cushion between the lip and the surface when the open side of the cavity is placed adjacent to the surface, thus creating a seal between the cavity and an environment external to the chamber.

29 Claims, 2 Drawing Sheets

AIR BEARING-SEALED MICRO-PROCESSING CHAMBER

CROSS-REFERENCE TO RELATED APPLICATION

This application claims the benefit of U.S. Provisional Patent Application No. 60/347,726, filed Jan. 11, 2002, which is incorporated herein by reference.

FIELD OF THE INVENTION

The present invention relates generally to fabrication of microelectronic devices, and specifically to a novel, miniaturized chamber for use in semiconductor wafer processing.

BACKGROUND OF THE INVENTION

The use of air bearings is well known in a variety of mechanical applications. Such bearings operate by creating a high-pressure cushion of gas between two surfaces in relative motion. The air bearing reduces the friction between the surfaces to a negligible level, and allows the surfaces to be held in very precise mutual alignment by proper control of the gas pressure. Due to the lack of friction, air bearings are generally characterized by low wear and, consequently, absence of particle generation due to such wear. For example, Anorad (Hauppauge, N.Y.) produces linear positioning stages based on high-performance air bearings. Air Bearing Technology (Hayward, Calif.) produces air bearing spindles and disk chucks, as well as ancillary equipment.

The use of air bearings in semiconductor processing equipment is also known in the art. For example, U.S. Pat. No. 5,898,179, whose disclosure is incorporated herein by reference, describes mechanical scanning apparatus for moving a semiconductor wafer inside a vacuum chamber, based on air bearing seals. The apparatus includes differentially-pumped integral air bearing vacuum seals that support both linear and rotary motion. The air bearing seals are produced by a combination of nozzles and vacuum grooves between the surfaces to be sealed. Gas is injected through the nozzles in order to create a high-pressure cushion between the surfaces, which also acts as a barrier to keep ambient air from entering the vacuum chamber. The gas is pumped out through the vacuum grooves in order to maintain a high vacuum within the chamber.

SUMMARY OF THE INVENTION

It is an object of some aspects of the present invention to provide improved apparatus and methods for processing a substrate under controlled atmospheric conditions, and particularly for processing semiconductor wafers and other elements used in producing microelectronic devices.

Preferred embodiments of the present invention provide a micro-chamber for processing of substrates such as semiconductor wafers. Rather than encompassing the entire substrate, in the manner of processing chambers known in the art, the micro-chamber covers and processes only a small area of the surface of the substrate at any one time. An air bearing seal is created between the periphery of the micro-chamber and the surface. This seal permits the micro-chamber to scan over the substrate without damage to the surface, while maintaining controlled atmospheric conditions—either vacuum or positive pressure—within the micro-chamber. By scanning the micro-chamber over the surface, typically using a linear mechanical scanner or a combination of linear and rotary scanning motions, the entire substrate can be processed. Multiple micro-chambers, each performing a different process step, may be controlled to scan the surface together (in a desired sequence) within a single processing tool.

Micro-chambers in accordance with preferred embodiments of the present invention can thus be used to reduce the size and increase the efficiency of wafer fabrication equipment. Because of the small volume of the micro-chambers, the quantity of chemicals and gases that they must use to carry out a given process step is typically small, thus saving on manufacturing costs and minimizing contamination and environmental pollution. Furthermore, maintaining process uniformity within the small processing volume of the micro-chamber is much easier than in a large chamber that can contain the entire wafer. As noted above, the micro-chamber can be scanned over the entire wafer, while maintaining uniform process conditions, so that the entire wafer is processed uniformly.

In some preferred embodiments of the present invention, a micro-chamber is used for particle removal and surface cleaning of semiconductor wafers and of other manufacturing elements, such as masks and reticles. The high-pressure gas injected into the bearing region around the micro-chamber creates an aerodynamic shearing force at the surface, which is helpful in dislodging contaminants from the surface. Within the micro-chamber, various means may be used for cleaning the surface, including (but not limited to) laser irradiation, particle bombardment, plasma generation, liquid and gaseous agents, and other means known in the art. Alternatively or additionally, micro-chambers may be used for other process steps, such as etching and passivation.

There is therefore provided, in accordance with a preferred embodiment of the present invention, apparatus for processing a surface of a substrate, including:

a chamber, including a chamber wall defining a cavity having one side that is open, the chamber wall including a lip surrounding the open side of the cavity; and gas ports disposed within the chamber wall and opening through the lip, the gas ports being adapted to emit a pressurized gas so as to create a gas cushion between the lip and the surface when the open side of the cavity is placed adjacent to the surface, thus creating a seal between the cavity and an environment external to the chamber.

Preferably, the apparatus includes a vacuum manifold for evacuating the chamber while the gas cushion maintains the seal between the cavity and the environment, wherein the vacuum manifold is disposed within the chamber wall and opens through the lip between the gas ports and the cavity.

In a preferred embodiment, the gas ports are adapted to emit the pressurized gas so as to create an aerodynamic shear force, which is effective to dislodge contaminants from the surface.

Preferably, the apparatus includes means disposed within the chamber for applying a manufacturing process to an area of the surface adjacent to the open side of the cavity. Most preferably, the means for applying the manufacturing process include means for cleaning the surface. Additionally or alternatively, the means for applying the manufacturing process include an inlet port, which is adapted to convey at least one of a gas, a vapor, a liquid and a stream of frozen particles into the cavity, and/or a radiation guide, which is adapted to direct radiation toward the area of the surface adjacent to the open side of the cavity. Typically, the substrate includes a semiconductor wafer, and the manufacturing process includes a process for fabricating microelectronic devices on the wafer.

Preferably, the apparatus includes a motion device, which is coupled to scan the chamber over the surface while maintaining the seal between the lip and the surface. Most preferably, the motion device includes a rotation mechanism, which is adapted to rotate the substrate about a rotation axis, and a translation mechanism, which is adapted to translate the chamber over the surface in a radial direction relative to the rotation axis.

There is also provided, in accordance with a preferred embodiment of the present invention, a method for processing a surface of a substrate, including:

placing a chamber that contains a cavity having one side that is open so that the open side of the cavity is adjacent to the surface; and directing a flow of a gas through a lip of the chamber surrounding the open side of the cavity so as to create a gas cushion between the lip and the surface, thus creating a seal between the cavity and an environment external to the chamber.

In a preferred embodiment, placing the chamber includes placing multiple chambers at respective positions adjacent to the surface, and directing the flow of the gas includes sealing each of the chambers against the surface, and applying the manufacturing process includes operating each of the chambers to apply a respective portion of the process. Preferably, operating each of the chambers includes operating at least first and second ones of the chambers to apply successive, first and second steps of the process, respectively.

There is additionally provided, in accordance with a preferred embodiment of the present invention, apparatus for processing a surface of a substrate, including:

a plurality of chambers, each such chamber including a chamber wall defining a cavity having one side that is open, the chamber wall including a lip surrounding the open side of the cavity;

gas ports disposed within the chamber wall and opening through the lip of each chamber, the gas ports being adapted to emit a pressurized gas so as to create a gas cushion between the lip and the surface when the open side of the cavity is placed adjacent to the surface, thus creating a seal between the cavity and an environment external to the chambers; and means disposed within each chamber for applying a respective portion of a manufacturing process to an area of the surface adjacent to the open side of the cavity.

The present invention will be more fully understood from the following detailed description of the preferred embodiments thereof, taken together with the drawings in which:

DETAILED DESCRIPTION OF PREFERRED EMBODIMENTS

Figure 1:
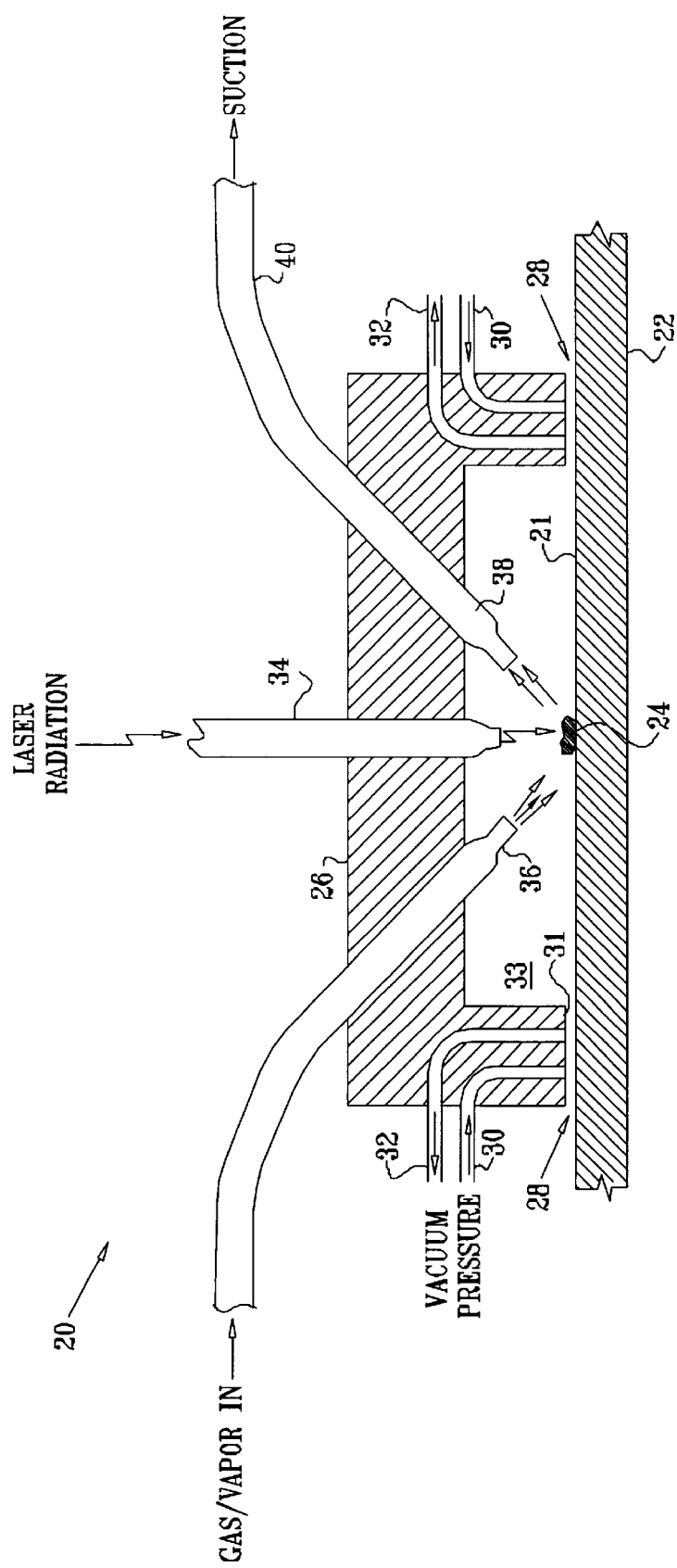
FIG. 1 is a schematic, sectional, side view of a micro-chamber used in cleaning a semiconductor wafer, in accordance with a preferred embodiment of the present invention.
Figure 3:
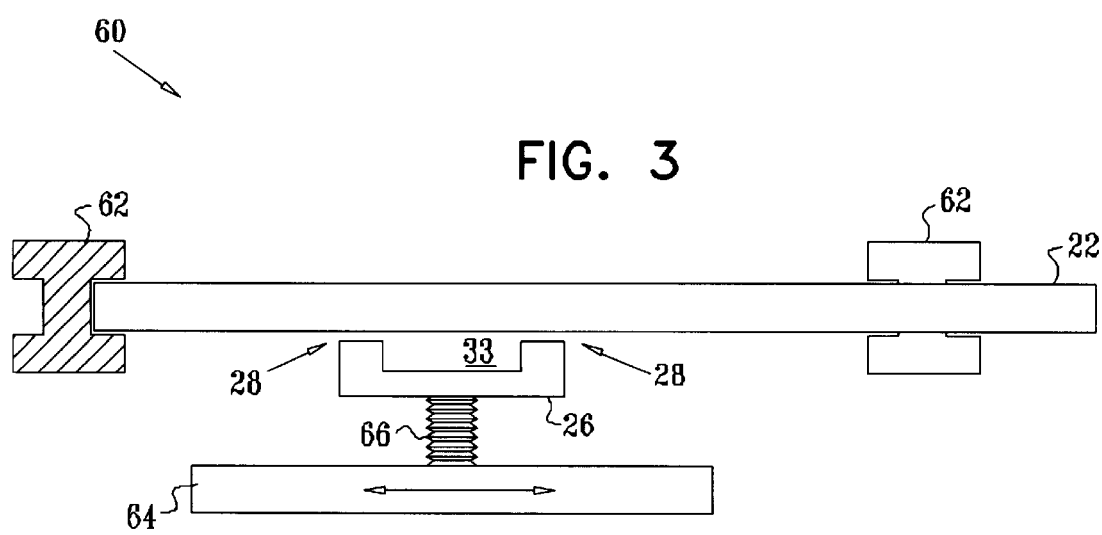
FIG. 3 is a schematic side view of a wafer processing tool that uses a micro-chamber, in accordance with another preferred embodiment of the present invention.

FIG. 1 is a schematic, sectional, side view of apparatus 20 for applying a manufacturing process to a surface 21 of a substrate 22. In the present example, substrate 22 is a semiconductor wafer, and the process applied is a cleaning process, which is intended to remove a particle 24 from the surface. For this purpose, a micro-chamber 26 is positioned over the surface. The chamber comprises a wall, which defines a cavity 33 between the chamber wall and surface 21. The wall may comprise substantially any suitable material, including ceramic, plastic, metal or quartz. Typically, only a small area of surface 21, preferably on the order of 1" square, is contained within chamber 26 at any given time. In operation of apparatus 20, chamber 26 does not contact surface 21, but rather floats over the surface on an air bearing seal 28, typically at a height between 5 and 20 $\mu$m from the surface. This seal is formed by flow of pressurized gas through a pressure manifold 30, which has multiple openings (of which two are shown in the figure) in a lip 31 of chamber 26, adjacent to surface 21. Optionally, when it is necessary to maintain a vacuum in cavity 33, a vacuum manifold 32 sucks out the pressurized gas that is used to form seal 28, so that the gas does not enter the cavity. Typically, the openings of pressure manifold 30 in lip 31 comprise nozzles, while vacuum manifold 32 comprises grooves in the lip, as described in the above-mentioned U.S. Pat. No. 5,898,179. Alternatively, other types of gas flow configurations may be used. The spacing between lip 31 and surface 21 at seal 28 is determined by the balance of the pressure of the gas emitted through manifold 30 against the weight of chamber 26. Additionally or alternatively, mechanical or magnetic force may be used to press the chamber more firmly against the surface. A mechanically- or magnetically-supported micro-chamber can thus be positioned below substrate 22, as shown in FIG. 3, rather than above it.

Chamber 26 also comprises means for applying a desired manufacturing process to surface 21. In the embodiment shown in FIG. 1, these means comprise a waveguide 34 for conveying radiation to the location of particle 24, along with an inlet tube 36 for process gases and an outlet tube 38 for evacuating cavity 33 and removing contaminants therefrom. Preferably, outlet tube 36 and vacuum manifold 32 are coupled to a pump or pumping system that is capable of pumping cavity 33 down to a pressure of about $10^{-8}$ torr. Because of the small volume of cavity 33, the chamber can be pumped down rapidly by a relatively small vacuum pump. Alternatively, the cavity may be pressurized for carrying out process steps requiring high pressure, such as wafer cleaning by frozen particle bombardment.

Preferably, inlet tube 36 is used to introduce a reactive or inert gas or a vapor, which cooperates with laser radiation injected through waveguide 34 in cleaning surface 21. Exemplary methods for surface cleaning processes of this sort are described in PCT Patent Application PCT/IL99/00701, in U.S. Pat. No. 4,987,286 and in U.S. patent application Ser. No. 09/721,167, which is assigned to the assignee of the present patent application. These three documents are incorporated herein by reference. Alternatively, chamber 26 may be used to apply other cleaning processes, as are known in the art, using only one or two of the means shown in the figure (waveguide 34 and tubes 36 and 38). Further alternatively, other processing means may be used for cleaning surface 21, such as a plasma generator or a source of very cold or frozen particles for bombarding surface 21. Substantially any cleaning process known in the art may be applied in this manner to surface 21, with the possible exception of processes based on immersion of substrate 22 in a solvent bath. Not only wafers may be cleaned in this manner, but also masks, reticles and other items having flat surfaces.

Pressure manifold 30 and vacuum manifold 32 are also capable of serving as processing means, for applying manufacturing processes to surface 21, in addition to their functions in creating air bearing seal 28. On the one hand, vacuum manifold 32 may be designed to provide sufficient suction so that a separate outlet tube 38 is not required to evacuate cavity 33. On the other hand, the gas flow created in the area of seal 28 by the pressure manifold and, optionally, by the vacuum manifold creates strong aerodynamic shear forces, which are themselves useful in dislodging particle 24 and other contaminants from the surface.

Alternatively, the processing means shown in FIG. 1 may be used for processes other than cleaning of surface 21, and chamber 26 may also comprise other means for processing substrate 22, which are not shown in the figures. For example, a plasma or chemical source may be provided for etching and/or passivation of surface 21. Heating and/or cooling may also be provided.

Figure 2:
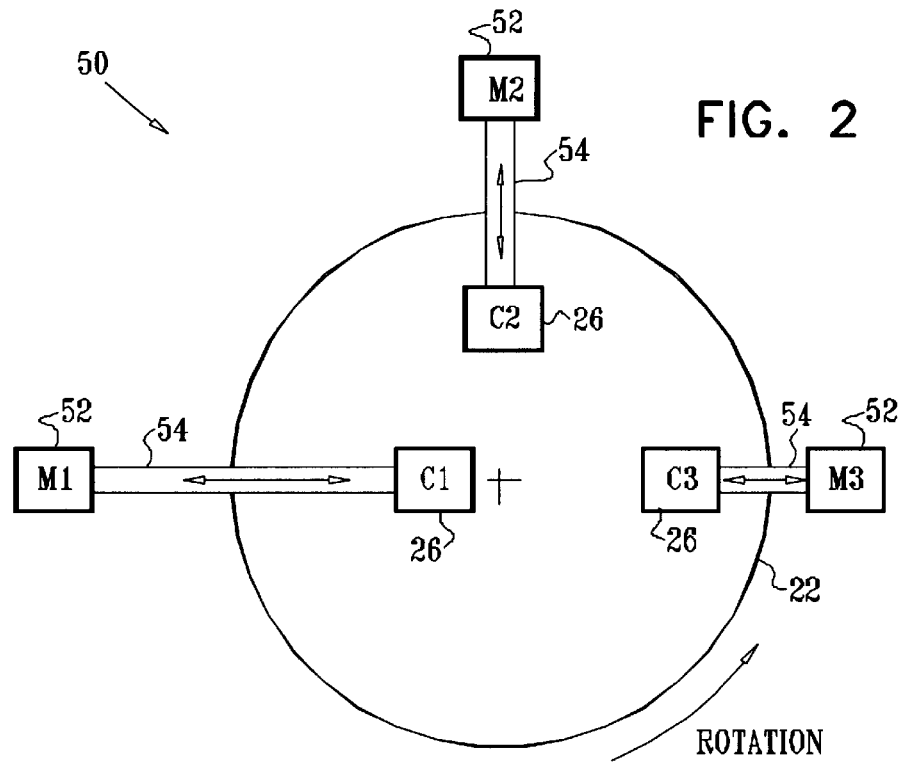
FIG. 2 is a schematic top view of a wafer processing tool that uses a number of micro-chambers, in accordance with a preferred embodiment of the present invention.

FIG. 2 is a schematic top view of apparatus 50 for processing substrate 22 using micro-chambers 26, in accordance with a preferred embodiment of the present invention. In this example, three micro-chambers, labeled C1, C2 and C3, are used to process different areas of the substrate simultaneously. Each of the micro-chambers is mounted on a translation arm 54, which is controlled by a mechanical actuator 52, such as a motor (labeled M1, M2 and M3, respectively). Substrate 22 is mounted on a rotating chuck or stage, which rotates the substrate about a central rotation axis. Actuators 52 and translation arms 54 move micro-chambers over the surface of substrate 22 in radial directions. This combination of rotational and translational motions enables the micro-chambers to scan conveniently over the entire surface.

Each of micro-chambers 26 comprises its own processing means, which may be of various types, as described above. All of the micro-chambers may be configured to carry out the same process step, such as wafer cleaning, wherein the use of multiple micro-chambers is useful in increasing process throughput. Alternatively, the different micro-chambers may carry out different steps, typically a number of steps in succession. Thus, for example, C1 may be used to perform a first step, beginning from the outer periphery of substrate 22 and progressing radially inward in a spiral pattern, followed by C2 with a second step, and C3 with the final step. A greater or smaller number of micro-chambers may likewise be used.

A variety of multi-step processes may be performed in this manner. For example, C1 may be used to apply a cleaning solvent to substrate 22, followed by a rinse with isopropyl alcohol (IPA) in C2. Finally, C3 may heat the substrate while applying a vacuum to remove any remaining contaminants from the surface. An advantage of this arrangement is that it allows both the wet and dry cleaning steps to be performed in the same processing station, without requiring a robot to transfer the substrate from one station to the next between steps. This approach not only saves valuable space in the plant, but also provides more effective cleaning, since particles loosened (but not removed) in C1 and C2 are vacuumed off the substrate immediately in C3, before they have had a chance to cool and harden. Laser cleaning may also be integrated in this process.

As another example, apparatus 50 may be used in a multi-step passivation/oxidation process, wherein substrate 22 is first exposed to a hot oxidizing gas (typically oxygen) in the first micro-chamber, followed by passivation (typically with nitrogen or hydrogen) in the second micro-chamber. Micro-chamber implementations of other multi-step processes will be apparent to those skilled in the art and are considered to be within the scope of the present invention. As a further alternative (not shown in the figures), one or more micro-chambers may be held stationary, while substrate 22 is rotated or translated beneath them. For example, a micro-chamber having a length approximately equal to the radius of the substrate may be held in a fixed position while the substrate rotates beneath the micro-chamber, thus scanning the micro-chamber over the entire surface.

FIG. 3 is a schematic side view of apparatus 60 for processing substrate 22, in accordance with a preferred embodiment of the present invention. In this embodiment, micro-chamber 26 is positioned to process a lower surface of substrate 22. The substrate is supported and rotated by a set of driving wheels 62, since a rotation stage or chuck beneath the substrate would interfere with the movement of micro-chamber 26. A translation stage 64 moves the micro-chamber in a radial direction and, optionally, in a tangential direction, as well. The micro-chamber is mounted on a spring 66, which presses it upwards toward the substrate. (In the embodiments described above, in which the micro-chamber is mounted above the substrate, the weight of the micro-chamber presses it against the substrate, and spring 66 is not generally needed.) The upward force exerted by spring 66 works against the downward pressure created by gas flow through pressure manifold 30 (FIG. 1) to maintain air bearing seal 28 between the micro-chamber and the substrate.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for processing a surface of a substrate, comprising:

a chamber, comprising a chamber wall defining a cavity having one side that is open, the chamber wall comprising a lip surrounding the open side of the cavity; and gas ports disposed within the chamber wall and opening through the lip, the gas ports being adapted to emit a pressurized gas so as to create a gas cushion between the lip and the surface when the open side of the cavity is placed adjacent to the surface, thus creating a seal between the cavity and an environment external to the chamber.

2. Apparatus according to claim 1, and comprising a vacuum manifold for evacuating the chamber while the gas cushion maintains the seal between the cavity and the environment.

3. Apparatus according to claim 2, wherein the vacuum manifold is disposed within the chamber wall and opens through the lip between the gas ports and the cavity.

4. Apparatus according to claim 1, wherein the gas ports are adapted to emit the pressurized gas so as to create an aerodynamic shear force, which is effective to dislodge contaminants from the surface.

5. Apparatus according to claim 1, and comprising means disposed within the chamber for applying a manufacturing process to an area of the surface adjacent to the open side of the cavity.

6. Apparatus according to claim 5, wherein the means for applying the manufacturing process comprise means for cleaning the surface.

7. Apparatus according to claim 5, wherein the means for applying the manufacturing process comprise an inlet port, which is adapted to convey at least one of a gas, a vapor, a liquid and a stream of frozen particles into the cavity.

8. Apparatus according to claim 5, wherein the means for applying the manufacturing process comprise a radiation guide, which is adapted to direct radiation toward the area of the surface adjacent to the open side of the cavity.

9. Apparatus according to claim 5, wherein the substrate comprises a semiconductor wafer, and wherein the manufacturing process comprises a process for fabricating microelectronic devices on the wafer.

10. Apparatus according to claim 1, and comprising a motion device, which is coupled to scan the chamber over the surface while maintaining the seal between the lip and the surface.

11. Apparatus according to claim 10, wherein the motion device comprises a rotation mechanism, which is adapted to rotate the substrate about a rotation axis, and a translation mechanism, which is adapted to translate the chamber over the surface in a radial direction relative to the rotation axis.

12. A method for processing a surface of a substrate, comprising:

placing a chamber that contains a cavity having one side that is open so that the open side of the cavity is adjacent to the surface; and directing a flow of a gas through a lip of the chamber surrounding the open side of the cavity so as to create a gas cushion between the lip and the surface, thus creating a seal between the cavity and an environment external to the chamber.

13. A method according to claim 12, and comprising evacuating the chamber while the gas cushion maintains the seal between the cavity and the environment.

14. A method according to claim 13, wherein evacuating the chamber comprises sucking gas out of the chamber through openings in the lip adjacent to the cavity.

15. A method according to claim 12, wherein directing the flow of the gas comprises emitting the gas through the lip under pressure so as to create an aerodynamic shear force, which is effective to dislodge contaminants from the surface.

16. A method according to claim 12, and comprising applying a manufacturing process within the chamber to an area of the surface adjacent to the open side of the cavity.

17. A method according to claim 16, wherein applying the manufacturing process comprises cleaning the surface.

18. A method according to claim 16, wherein applying the manufacturing process comprises conveying at least one of a gas, a vapor, a liquid and a stream of frozen particles into the cavity.

19. A method according to claim 16, wherein applying the manufacturing process comprises directing radiation toward the area of the surface adjacent to the open side of the cavity.

20. A method according to claim 16, wherein the substrate comprises a semiconductor wafer, and wherein applying the manufacturing process comprises performing one or more steps of fabricating microelectronic devices on the wafer.

21. A method according to claim 16, wherein placing the chamber comprises placing multiple chambers at respective positions adjacent to the surface, and wherein directing the flow of the gas comprises sealing each of the chambers against the surface, and wherein applying the manufacturing process comprises operating each of the chambers to apply a respective portion of the process.

22. A method according to claim 21, wherein operating each of the chambers comprises operating at least first and second ones of the chambers to apply successive, first and second steps of the process, respectively.

23. A method according to claim 12, and comprising scanning the chamber over the surface while maintaining the seal between the lip and the surface.

24. A method according to claim 23, wherein scanning the chamber comprises rotating the substrate about a rotation axis, and translating the chamber over the surface in a radial direction relative to the rotation axis.

25. Apparatus for processing a surface of a substrate, comprising:

a plurality of chambers, each such chamber comprising a chamber wall defining a cavity having one side that is open, the chamber wall comprising a lip surrounding the open side of the cavity;

gas ports disposed within the chamber wall and opening through the lip of each chamber, the gas ports being adapted to emit a pressurized gas so as to create a gas cushion between the lip and the surface when the open side of the cavity is placed adjacent to the surface, thus creating a seal between the cavity and an environment external to the chambers; and means disposed within each chamber for applying a respective portion of a manufacturing process to an area of the surface adjacent to the open side of the cavity.

26. Apparatus according to claim 25, wherein the plurality of chambers comprises at least first and second chambers, and wherein the means disposed within each chamber comprise first and second means disposed respectively within the first and second chambers for performing successive, first and second steps of the process, respectively.

27. Apparatus according to claim 25, wherein the substrate comprises a semiconductor wafer, and wherein the manufacturing process comprises a process for fabricating microelectronic devices on the wafer.

28. Apparatus according to claim 25, and comprising one or more motion devices, which are coupled to scan the chambers over the surface while maintaining the seal between the lip and the surface.

29. Apparatus according to claim 28, wherein the motion devices comprise a rotation mechanism, which is adapted to rotate the substrate about a rotation axis, and a plurality of translation mechanisms, which are respectively coupled to translate the plurality of the chambers over the surface in a radial direction relative to the rotation axis.

* * * * *